(12) United States Patent  
Zhou et al.

(10) Patent No.: US 8,017,193 B1  
(45) Date of Patent: Sep. 13, 2011

(54) MONOMERIC FORMULATION FOR MAKING POLYMER WAVEGUIDES

(75) Inventors: Chaoyin Zhou, Chino, CA (US); Alan J. Jacobsen, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 135 days.

(21) Appl. No.: 12/187,201

(22) Filed: Aug. 6, 2008

(51) Int. Cl.  
*C08G 75/02* (2006.01)  
*G03F 7/004* (2006.01)  
*G02B 6/10* (2006.01)

(52) U.S. Cl. ............ 427/510; 522/44; 522/46; 522/48; 522/60; 522/79; 522/174; 522/180; 522/173; 522/178; 522/181; 522/184; 522/186; 522/42; 430/281.1; 430/269; 385/129; 385/131

(58) Field of Classification Search ............... 522/42, 522/46, 48, 60, 173, 178, 180, 182, 44, 79, 522/174, 181, 184, 186; 430/281.1, 286.1, 430/269; 427/510  
See application file for complete search history.

(56) References Cited

U.S. PATENT DOCUMENTS

| | | | |
|---|---|---|---|
| 3,900,594 A * | 8/1975 | Guthrie et al. ............... 427/517 |
| 5,136,682 A * | 8/1992 | Moyer et al. ................. 385/141 |
| 5,236,967 A * | 8/1993 | Ohkawa et al. .............. 522/32 |
| 5,736,609 A * | 4/1998 | Irizato et al. ................. 525/131 |
| 6,008,296 A * | 12/1999 | Yang et al. ................... 525/123 |
| 6,306,563 B1 * | 10/2001 | Xu et al. ...................... 430/321 |
| 6,631,231 B2 | 10/2003 | Mizuuchi et al. |
| 6,650,817 B2 | 11/2003 | Murali |
| 6,660,192 B1 | 12/2003 | Kim et al. |
| 6,684,007 B2 | 1/2004 | Yoshimura et al. |
| 6,824,934 B2 * | 11/2004 | Eldada et al. ................ 430/7 |
| 6,862,393 B2 | 3/2005 | Nashimoto |
| 6,879,757 B1 | 4/2005 | Zhou et al. |
| 6,952,504 B2 | 10/2005 | Bi et al. |
| 7,011,932 B2 * | 3/2006 | Ferm et al. .................. 430/321 |
| 7,020,374 B2 | 3/2006 | Talin et al. |
| 7,024,093 B2 | 4/2006 | Shelnut et al. |
| 7,361,450 B2 * | 4/2008 | Koyanagi et al. ........... 430/287.1 |
| 7,382,959 B1 * | 6/2008 | Jacobsen ...................... 385/129 |
| 7,541,391 B2 * | 6/2009 | Gorczyca et al. ............ 522/178 |
| 2004/0021237 A1 | 2/2004 | Shimizu et al. |
| 2004/0264863 A1 | 12/2004 | Suzuki et al. |
| 2005/0069637 A1 | 3/2005 | Bae et al. |
| 2005/0287696 A1 | 12/2005 | Dumais et al. |
| 2006/0029348 A1 | 2/2006 | Kempen et al. |

OTHER PUBLICATIONS

Kewitsch et al., "Nonlinear Optical Properties of Photoresists for Projection Lithography," Applied Physics Letters, Jan. 22, 1996, 455-457, vol. 68 (No. 4), USA.

(Continued)

*Primary Examiner* — Susan W Berman  
(74) *Attorney, Agent, or Firm* — Christie, Parker, Hale

(57) ABSTRACT

A monomeric formulation for creating self-propagating polymer optical waveguides and a system and a method of using the same. The monomeric formulation includes a plurality of unsaturated molecules, a molecule having a structure of R—X—H (e.g., X=O, S, N), and a photoinitiator. The monomeric formulation can further include a free radical inhibitor. The system includes a light source, a reservoir having a monomeric formulation and a patterning apparatus configured to guide a light beam from the light source into the monomeric formulation to form at least one self-propagating polymer waveguide.

24 Claims, 4 Drawing Sheets

OTHER PUBLICATIONS

Shoji et al., "Optically-Induced Growth of Fiber Patterns into a Photopolymerizable Resin," Applied Physics Letters, Aug. 2, 1999, 737-739, vol. 75 (No. 5), USA.

Kagami et al., "Light-Induced Self-Written Three-Dimensional Optical Waveguide," Applied Physics Letters, Aug. 20, 2001, 1079-1081, vol. 79 (No. 8), USA.

Chuang et al., "A New Method to Fabricate Polymer Waveguides," Progress in Electromagnetics Research Symposium, Aug. 22-26, 2005, 92-95, Hangzhou, China.

Nason et al., "UV-Induced Frontal Polymerization of Multifunctional (Meth)acrylates," Macromolecules 2005, vol. 38, pp. 5506-5512.

Ivanov et al., "Kinetic Study of Photoinitiated Frontal Polymerization," Polymer International, 2001, vol. 50, pp. 113-118.

* cited by examiner

MONOMERIC FORMULATION FOR MAKING POLYMER WAVEGUIDES

CROSS-REFERENCE TO RELATED APPLICATION(S)

This application relates to U.S. patent application Ser. No. 11/580,335, filed on Oct. 13, 2006 entitled "Optically Oriented Three-Dimensional Polymer Microstructures" and U.S. patent application Ser. No. 11/801,908, filed on May 10, 2007 entitled "Three-Dimensional Ordered Open-Cellular Structures." The entire contents of the above-referenced applications are incorporated herein by reference.

FIELD OF THE INVENTION

The present invention relates to fabrication of polymer waveguides, and in particular to monomeric formulations for the fabrication of polymer waveguides.

BACKGROUND

An ordered three-dimensional (3D) microstructure is an ordered 3D structure at the micrometer or nanometer scale. Such 3D microstructure can be manufactured from polymer materials such as polymer cellular materials. Currently, polymer cellular materials that are mass produced are created through various foaming processes, which all yield random (not ordered) 3D microstructures. Techniques do exist to create polymer materials with ordered 3D microstructures, such as stereolithography techniques; however, these techniques rely on a bottom-up, layer-by-layer approach which prohibits scalability.

A stereolithography technique provides a method to build a 3D microstructure in a layer-by-layer process. This process usually involves a platform (e.g., substrate) that is lowered into a photo-monomer bath in discrete steps. At each layer, a laser is used to scan over the area of the photo-monomer that is to be cured (i.e., polymerized) for that particular layer. Once the layer is cured, the platform is lowered by a specific amount (i.e., determined by the processing parameters and desired feature/surface resolution), and the process is repeated until the complete 3D structure is created. One example of such a stereolithography technique is disclosed in Hull et al., "Apparatus For Production Of Three-Dimensional Objects By Stereolithography," U.S. Pat. No. 4,575,330, Mar. 11, 1986, which is incorporated by reference herein in its entirety.

Modifications to the above described stereolithography technique have been developed to improve the resolution by using laser optics and special resin formulations, as well as modifications to decrease the fabrication time of the 3D structure by using a dynamic pattern generator to cure an entire layer at once. One example of such a modification is disclosed in Bertsch et al., "Microstereolithography: A Review," Materials Research Society Symposium Proceedings, Vol. 758, 2003, which is incorporated by reference herein in its entirety. A fairly recent advancement to the standard stereolithography technique includes a two-photon polymerization process as disclosed in Sun et al., "Two-Photon Polymerization And 3D Lithographic Microfabrication," APS, Vol. 170, 2004, which is incorporated by reference herein in its entirety. However, this advance process still relies on a complicated and time consuming layer-by-layer approach.

3D ordered polymer cellular structures have also been created using optical interference pattern techniques, also called holographic lithography; however, structures made using these techniques have an ordered structure at the nanometer scale and the structures are limited to the possible interference patterns, as described in Campbell et al., "Fabrication Of Photonic Crystals For The Visible Spectrum By Holographic Lithography," NATURE, Vol. 404, Mar. 2, 2000, which is incorporated by reference herein in its entirety.

Previous works have also been done on creating polymer optical waveguides. A polymer optical waveguide can be formed in certain photopolymers that undergo a refractive index change during the polymerization process. When a monomer that is photo-sensitive is exposed to light (e.g., UV light) under the right conditions, the initial area of polymerization, such as a small circular area, will "trap" the light and guide it to the tip of the polymerized region due to the index of refraction change, further advancing that polymerized region. This process will continue, leading to the formation of a waveguide structure with approximately the same cross-sectional dimensions along its entire length. The existing techniques to create polymer optical waveguides have only allowed one or a few waveguides to be formed, and these techniques have not been used to create a self-supporting three-dimensional structure by patterning polymer optical waveguides.

Therefore, it is desirable to provide a polymeric system and method that is suitable for creating polymer waveguides.

SUMMARY OF THE INVENTION

Embodiments of the present invention provide a system and a method of using various monomeric formulations for fabricating self-propagating polymer waveguides by photopolymerization.

According to an embodiment of the present invention, a monomeric formulation for the fabrication of self-propagating polymer waveguides by photopolymerization is provided. The monomeric formulation includes: a plurality of unsaturated molecules; a molecule having a structure of R—X1-H, X1 being selected from a group consisting of O, S, and N; and a photo initiator.

According to another embodiment of the present invention, a system for forming at least one self-propagating polymer waveguide by photopolymerization is provided. The system includes a collimated light source for producing a light beam; a reservoir having a monomeric formulation adapted to polymerize under a light exposure generated by the light beam; and a patterning apparatus configured to guide a portion of the light beam into the monomer to form at least one polymer waveguide through a portion of a volume of the monomeric formulation. The monomeric formulation includes a plurality of unsaturated molecules, a molecule having a structure of R—X1-H (e.g., X1=O, S, or N), a photoinitiator.

According to yet another embodiment of the present invention, a method for forming at least one polymer waveguide is provided. The method includes forming a volume of a monomeric formulation, securing a mask having at least one aperture between a collimated light source and the volume of the monomeric formulation, and directing a collimated light beam from the collimated light source to the mask for a period of exposure time so that a portion of the collimated beam passes through the mask and is guided by the at least one aperture into the volume of the monomeric formulation to form at least one waveguide through a portion of the volume of the monomeric formulation. The monomeric formulation includes a plurality of unsaturated molecules, a molecule having a structure of R—X1-H (e.g., X1=O, S, or N), and a photoinitiator.

The unsaturated molecules may be between 3% and 97% by weight of the monomeric formulation.

Each of the unsaturated molecules may include C=X2 double bonds or C≡X2 triple bonds, wherein X2 is selected from a group consisting of C, N, O, and S.

The C=X2 double bonds or C≡X2 triple bonds may be located at terminal positions of a corresponding one of the unsaturated molecules.

Each of the unsaturated molecules may include one or more different vinyl groups.

The unsaturated molecules may be selected from a group consisting of ethynyl, cyanide, vinyl ether, vinyl ester, vinyl amides, vinyl triazine, vinyl isocyanurate, acrylate, methacrylate, diene, and triene.

The unsaturated molecules may be selected from a group consisting of pentaerythritol tetraacrylate; 2,4,6-triallyloxy-1,3,5-triazine; triallyl-1,3,5-triazine-2,4,6-trione; and tricyclohexane.

The molecule having a structure of R—X1-H may be between about 3% and about 97% by weight of the monomeric formulation.

The molecule having a structure of R—X1-H may include a part of an organic group. The part of an organic group may include a part of an alkyl group or ester group.

The photoinitiator may be more than 0% and less than about 10% of total weight of the monomeric formulation.

The photoinitiator may generate free radicals under a light exposure by one of intramolecular bond cleavage or intermolecular hydrogen abstraction.

The collimated light source may have a wavelength between about 200 nm and about 500 nm.

The photoinitiator may be selected from a group consisting of 2,2-dimethoxy-2-phenylacetophenone; 2-hydroxy-2-methylpropiophenone; camphorquinone; benzophenone; and benzoyl peroxide.

The monomeric formulation may further include a free radical inhibitor. The free radical inhibitor may be selected from a group consisting of hydroquinone, methylhydroquinone, ethylhydroquinone, methoxyhydroquinone, ethoxyhydroquinone, monomethylether hydroquinone, propylhydroquinone, propoxyhydroquinone, tert-butylhydroquinone, and n-butylhydroquinone.

DESCRIPTION OF THE EMBODIMENTS

Figure 1:
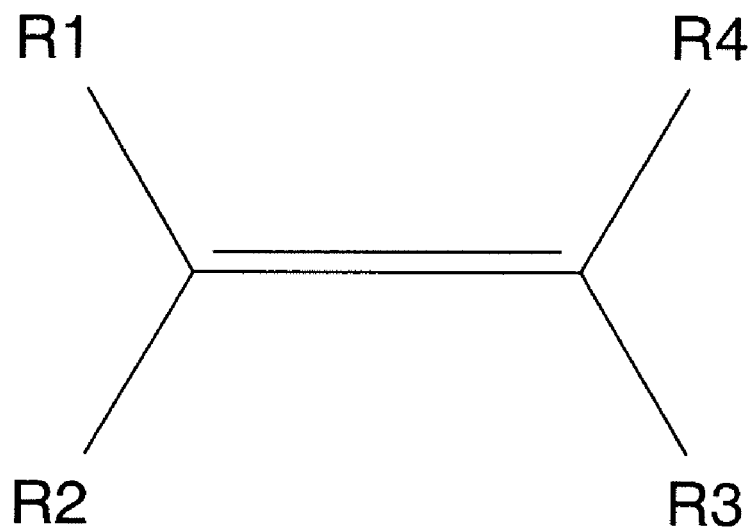
FIG. 1 illustrates an exemplary structure of a vinyl group according to an embodiment of the present invention.

Embodiments of the present invention provide a system and a method of using various monomeric formulations for creating self-propagating polymer optical waveguides suitable for constructing open-cellular polymer structures such as an interconnected 3D pattern of self-propagating polymer optical waveguides as described in U.S. patent application Ser. No. 11/580,335 (hereinafter as '335 application), filed on Oct. 13, 2006, entitled "Optically Oriented Three-Dimensional Polymer Microstructures." The entire content of which is incorporated herein by reference.

Photopolymers undergo a refractive index change during the polymerization process that can lead to the formation of polymer optical waveguides. If a monomer that is photosensitive is exposed to light (e.g., UV light) under the right conditions, the initial area of polymerization (e.g., a small circular area) will "trap" the light and guide it to the tip of the polymerized region, further advancing that polymerized region. This process will continue, leading to the formation of a waveguide structure with approximately the same cross-sectional dimensions along its entire length. This phenomenon may be applied to form interconnected pattern of self-propagating polymer waveguides as disclosed in the '335 application.

The formation of a polymer waveguide requires an index of refraction change between the liquid monomer and the solid polymer. To enable self-propagation of the polymer waveguide, the polymer must be as transparent as possible to the wavelength(s) of the light that will be used to generate free radicals and induce polymerization. In addition to these requirements, the polymerization of waveguides to form a three-dimensional open-cellular polymer structure requires a reactivity such that the reaction will stop when the light exposure is off to avoid over-curing of the monomer that surrounds the polymer waveguide.

Embodiments of the present invention provides a polymeric system and a method of using various monomeric formulations that enable the creation of a polymer waveguide suitable for the construction of 3D open-cellular polymer structures. According to an embodiment of the present invention, monomeric formulations suitable to be used in the polymeric system contains at least three chemical components: (a) unsaturated molecules; (b) molecules having a structure of R—X—H (e.g., X=O, S, or N) with about 3-97% by weight; and (c) photo-initiators at more than 0% and less than 10% of total weight of the polymer.

Regarding component (a), unsaturated molecules may contain C=X double bonds or C≡X triple bonds (e.g., X=C, N, O, or S). The substitution on the multiple bonds can be any atoms such as H, F and Cl, or groups such as alkyl groups, esters, amine groups, hydroxyl groups and CN. One or more of these double bonds or triple bonds can be present in the unsaturated molecules. Also, they can contain different combination of these different multiple bonds. Of these different multiple bonds, the most common ones are the C=C double bonds at the terminal position (e.g., three substitutions on the C=C bonds are hydrogen atoms).

FIG. 1 shows an exemplary structure of a vinyl group. R1, R2, R3 and R4 can be any atoms or groups. Any structure containing carbon-carbon double bonds can participate in the photopolymerization process. In some embodiments, the vinyl groups are located at the terminal positions (i.e., R1, R2, R3 and R4 are hydrogen atoms). Different structures exhibit different reaction rates, and the presence of other functional groups in the structure such as CN, Cl, or OH also affect the reaction rate. A molecular structure may contain one or more different double or triple bonds, and one or more of these different structures can be used in the polymerization process. Since various combinations of double or triple bonds can be used in the polymerization process, polymer systems with very different physical properties can be created.

Regarding component (b), in further detail, the component can have a structure of R—X—H, where X=O, S, N with about 3-97% by weight. The R groups can be organic groups such as alkyl groups, esters, amines and hydroxyl. For example, a molecule that contains one or more thio-functional groups in the structure can be used in the polymerization. The reaction rate varies depending on the different thio-containing molecules utilized.

Regarding component (c), any compound which can generate free radicals under light by either intramolecular bond cleavage or intermolecular hydrogen abstraction is a photoinitiator and can be used in the polymerization process. Furthermore, one or more different types of photoinitiators can be used in the polymerization process and usually result in different reaction rates.

Figure 2:
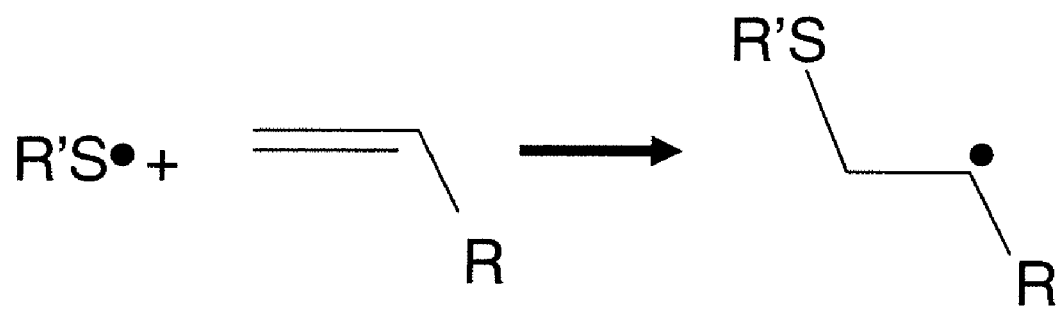
FIG. 2 illustrates exemplary free radicals generated as key intermediates during the propagation step in an exemplary polymerization process according to the embodiments of the present invention.

FIG. 2 illustrates exemplary free radicals generated as key intermediates during the propagation step in an exemplary polymerization process according to embodiments of the present invention.

By way of example, in a mixture of the three components (a), (b) and (c) described above, free radicals are generated by the photoinitiator when exposed to the appropriate wavelength of light, and these highly reactive free radicals react with the thio-containing molecules producing thiyl radicals that are further transferred to the vinyl groups as illustrated in FIG. 2.

Furthermore, a component (d) can be included in the polymeric system. Component (d) is a free radical inhibitor which can be added to the monomeric formulation to help reduce unwanted polymerization of the regions outside the optical waveguide. Polymerization of the unexposed regions outside the waveguide may occur from residual heat generated from the polymerization reaction or from light that "leaks out" of the waveguide during light exposure.

Exemplary materials for component (d) can be selected from one or a combination of hydroquinone, methylhydroquinone, ethylhydroquinone, methoxyhydroquinone, ethoxyhydroquinone, monomethylether hydroquinone, propylhydroquinone, propoxyhydroquinone, tert-butylhydroquinone and n-butylhydroquinone. Component (d) is suitably selected to be between 0-3% by weight of the total material composition.

Figure 3:
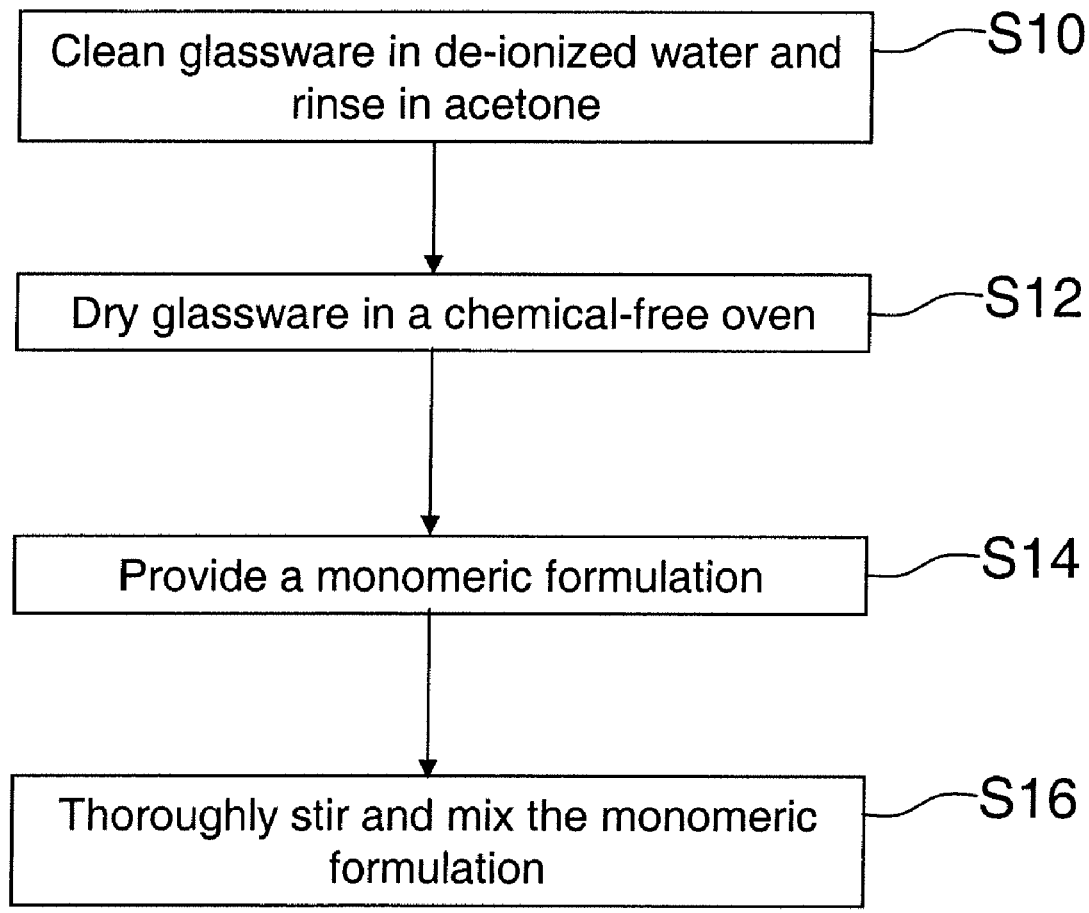
FIG. 3 is a flowchart illustrating an embodiment of an exemplary process for providing and preparing a monomeric formulation for polymerization according to an embodiment of the present invention.

FIG. 3 is a flowchart illustrating an exemplary process for preparing a monomeric formulation suitable for polymerization according to an embodiment of the present invention.

Referring to FIG. 3, in step S10, suitable glassware (or containers with similar properties as glassware) are provided and thoroughly cleaned in de-ionized water and rinsed in acetone. Then, in step S12, the glassware are dried in a chemical-free oven at about 110° C. for at least about two hours and stored in a desiccator (or a device providing similar function) before use. In step S14, a monomeric formulation (e.g., a mixture) is provided including, for example, the following components: 100 parts pentaerythritol tetraacrylate, 200 parts pentaerythritol tetrakis(2-mercaptoacetate), and 0.5 parts 2,2-dimethoxy-2-phenylacetophenone (i.e., all parts by weight). In step S16, the components are thoroughly stirred or blended to make sure the components are well mixed, and the solution is a uniform system. In one embodiment, a monomeric formulation of 200 grams can readily be used for polymerization after the components are well mixed or be used later after a period of time (e.g., 12-24 hours) at room temperature (e.g., 20-25° C.). For prolonged storage, the mixture can be stored in a refrigerator at a temperature around 5° C. to inhibit or prevent free-radical production.

Figure 4:
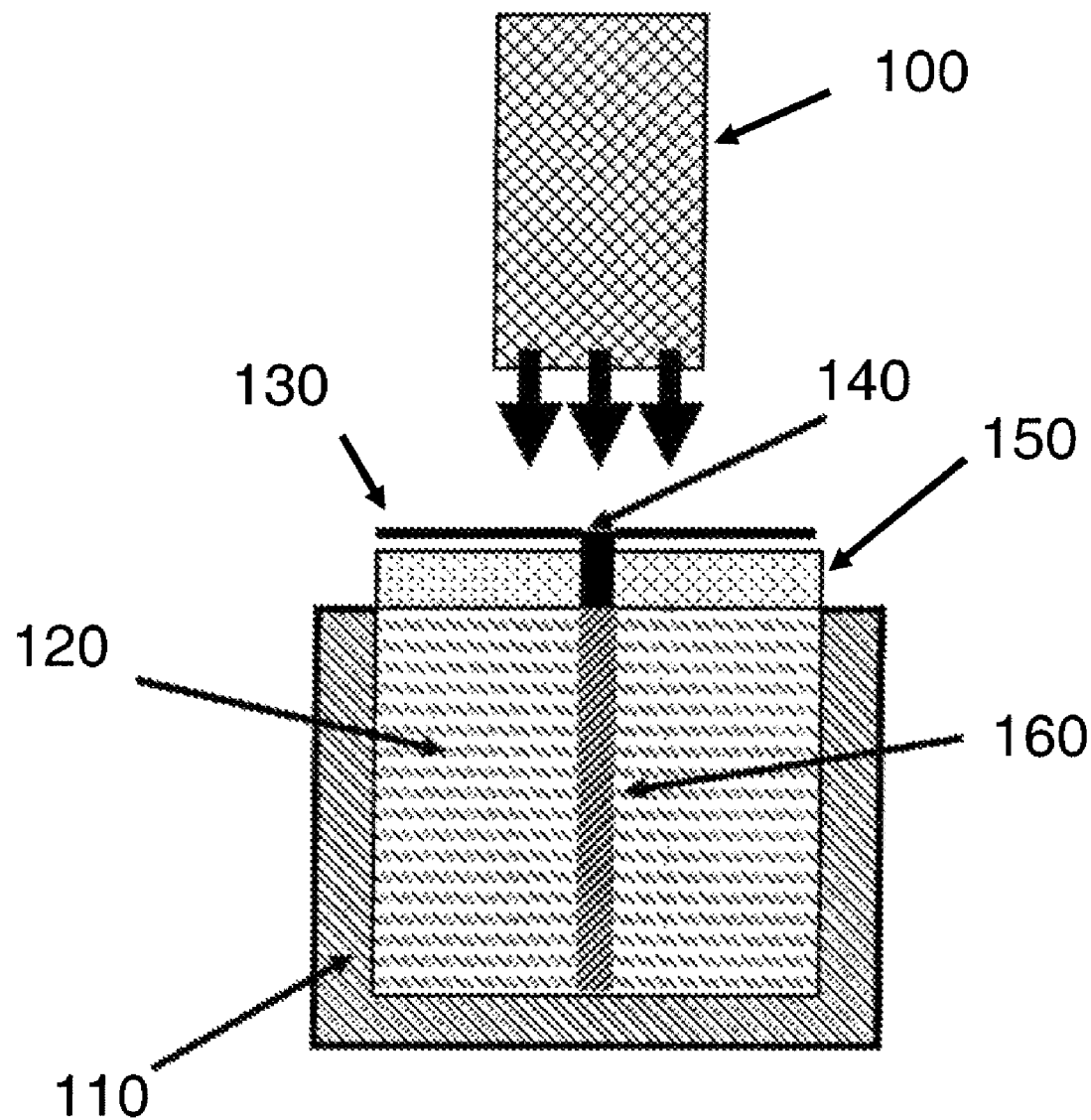
FIG. 4 illustrates a system for forming a single optical polymer waveguide according to an embodiment of the present invention.

FIG. 4 illustrates a system to fabricate a single optical polymer waveguide according to an embodiment of the present invention. The system includes a light source (e.g., a collimated light source) 100, a reservoir (e.g., a mold) 110 having a volume of monomer 120 that will polymerize at a wavelength of a collimated light beam provided by the light source 100, and a patterning apparatus 130 (e.g., a mask) with a single aperture 140 (e.g., open area) of a suitable shape and dimension. For example, the aperture 140 may be in a shape of a triangle, a pentagon, a hexagon, a polygon, an oval, a star, etc. The volume of monomer 120 can be prepared, for example, according to the process illustrated in FIG. 3.

Referring to FIG. 4, a single collimated beam is directed through the aperture 140 in the patterning apparatus 130 to the monomer 120. Between the patterning apparatus 130 and the monomer 120, there may be a substrate 150. The substrate can be composed of a material, such as glass, Mylar, and other suitable materials that will transmit the incident light beam to the monomer 120. That is, in one embodiment of the present invention, the substrate 150 is substantially transparent to the incident light beam. On the surface of the monomer 120, in the area exposed to a portion of the light beam, an optical waveguide 160 will begin to polymerize.

The index of refraction change between the polymer and monomer will "trap" and "focus" the light in the polymer and guide the polymerization process. Due to this self-guiding/self-focusing effect, the polymerized waveguide 160 will form with an approximately constant cross-section and a length much greater than the cross-sectional dimensions. The direction in which this polymer waveguide 160 will grow is dependent on the direction of the incident beam. The cross-section of the polymer waveguide 160 is dependent on the shape and dimensions of the incident collimated beam, which in turn is dependent on the shape and dimensions of the aperture 140 in the patterning apparatus 130. The length to which the polymer waveguide 160 can "grow" is dependent on a number of parameters including the size, intensity, and exposure time of the incident beam, as well as the light absorption/transmission properties of the photopolymer. The time in which it takes to form a polymer waveguide depends on the kinetics of the polymerization process.

Figure 5:
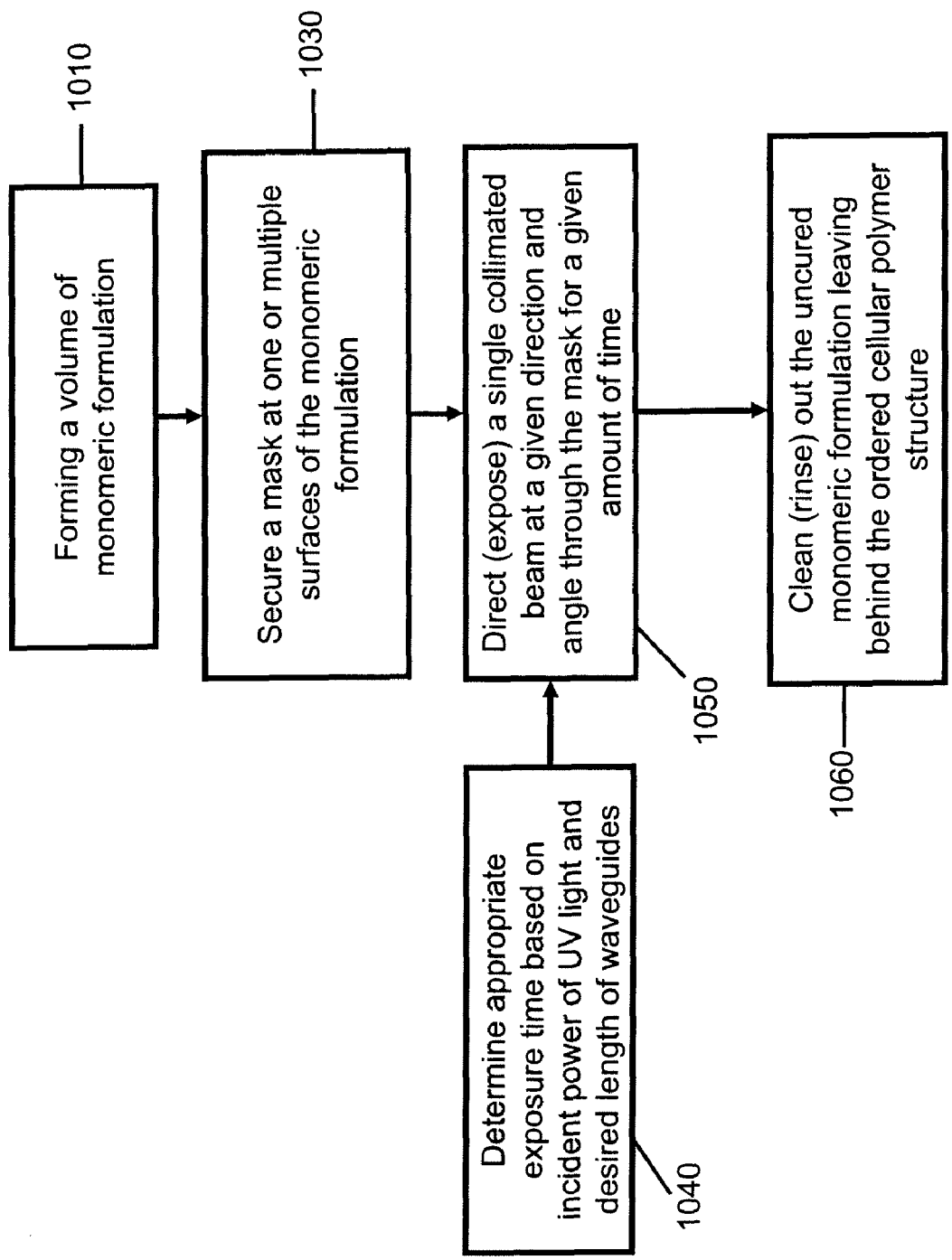
FIG. 5 illustrates a method of forming a polymer waveguide according to an embodiment of the present invention.

FIG. 5 shows a method of forming a polymer waveguide according to an embodiment of the present invention. A monomeric formulation can be prepared, for example, according to the process illustrated in FIG. 3. In block 1010, a volume of the monomeric formulation is secured (e.g., in a reservoir). A patterning apparatus, such as a mask having a designed geometry, is secured in block 1030. Here, the secured mask has at least one aperture between at least one collimated light source and the volume of the selected photo-monomeric formulation. In addition, the mask may be in contact with the photo-monomeric formulation or separated by a substrate (e.g., by a UV transparent substrate).

In block 1040, an appropriate exposure time is determined based on incident power of a collimated light beam from the at least one collimated light source (e.g., an incident power of an UV light) and a desired length of one or more waveguides. The collimated light beam from the at least one collimated light source is directed to the mask for a period of exposure time so that a portion of the collimated beam passes through the mask and is guided by the at least one aperture into the photo-monomeric formulation to form at least one waveguide through a portion of the volume of the photo-monomeric formulation. Here, the at least one waveguide has a cross sectional geometry substantially matching the designed aperture geometry on the mask.

As shown in block 1050, a single collimated beam at a given direction and angle is directed through the mask for a given amount of time. Then, at block 1060, any uncured photo-monomeric formulation is removed to leave behind a polymer waveguide.

In one embodiment, the monomeric formulations may use one of 2-hydroxy-2-methylpropiophenone, camphorquinone, benzophenone, or benzoyl peroxide to replace 2,2-dimethoxy-2-phenylacetophenone as the photoinitiator.

In another embodiment, the monomeric formulations may use one of 2,4,6-triallyloxy-1,3,5-triazine, triallyl-1,3,5-triazine-2,4,6-trione, or tricyclohexane to replace pentaerythritol tetraacrylate as the vinyl monomer (or other suitable unsaturated molecules). A person with ordinary skill in the art should appreciate that the amount used for each of the individual monomeric formulations may be slightly changed depending on their molecular weights.

In still a further embodiment, the monomeric formulations may use ethandithiol, or pentaerythritol tetrakis(3-mercaptopropionate) to replace pentaerythritol tetrakis(2-mercaptoacetate).

While the present invention has been described in connection with certain exemplary embodiments, it is to be understood that the invention is not limited to the disclosed embodiments, on the contrary, it is intended to cover various modifications and equivalent arrangements included within the spirit and scope of the appended claims, and equivalents thereof.

What is claimed is:

1. A monomeric formulation for the fabrication of self-propagating polymer waveguides by photopolymerization, the monomeric formulation comprising:
    a first molecule comprising at least one C═C double bond or C≡C triple bond;
    a second molecule comprising two or more SH groups;
    a photoinitiator selected from the group consisting of 2,2-dimethoxy-2-phenylacetophenone; 2-hydroxy-2-methylpropiophenone; camphorquinone; benzophenone; and benzoyl peroxide, and combinations thereof; and
    a free radical inhibitor comprising a compound selected from the group consisting of methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations thereof, the free radical inhibitor being present at a positive amount between 0-3% by weight of the monomeric formulation, and the free radical inhibitor being present in an amount sufficient to reduce polymerization of the monomeric formulation outside the waveguides while propagating the polymer waveguides.

2. The monomeric formulation of claim 1, wherein the first molecule is between 3% and 97% by weight of the monomeric formulation.

3. The monomeric formulation of claim 1, wherein the at least one C═C double bond or C≡C triple bond is located at a terminal position of the first molecule.

4. The monomeric formulation of claim 1, wherein the first molecule comprises one or more vinyl groups.

5. The monomeric formulation of claim 1, wherein the first molecule comprises at least one functional group selected from the group consisting of ethynyl, vinyl ether, vinyl ester, vinyl amide, vinyl triazine, vinyl isocyanurate, acrylate, methacrylate, diene, and triene.

6. The monomeric formulation of claim 1, wherein the first molecule is selected from the group consisting of pentaerythritol tetraacrylate; 2,4,6-triallyloxy-1,3,5-triazine; triallyl-1,3,5-triazine-2,4,6-trione; and combinations thereof.

7. The monomeric formulation of claim 1, wherein the second molecule is between 3% and 97% by weight of the monomeric formulation.

8. The monomeric formulation of claim 1, wherein the second molecule comprises an alkyl group or an ester group.

9. The monomeric formulation of claim 1, wherein the photoinitiator is more than 0% and less than 10% of total weight of the monomeric formulation.

10. The monomeric formulation of claim 1, wherein the photoinitiator generates free radicals under a light exposure by one of intramolecular bond cleavage or intermolecular hydrogen abstraction.

11. The monomeric formulation of claim 10, wherein the light exposure is produced from a light having a wavelength between 200 nm and 500 nm.

12. A monomeric formulation for the fabrication of self-propagating polymer waveguides by photopolymerization, the monomeric formulation comprising:
    a first molecule comprising at least one functional group selected from the group consisting of ethynyl, vinyl ether, vinyl ester, vinyl amide, vinyl triazine, vinyl isocyanurate, acrylate, methacrylate, diene, and triene;
    a second molecule comprising two or more —SH groups;
    a photoinitiator; and
    a free radical inhibitor comprising a compound selected from the group consisting of methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations thereof, the free radical inhibitor being present at a positive amount between 0-3% by weight of the monomeric formulation, the free radical inhibitor being present in an amount sufficient to reduce polymerization of the monomeric formulation outside the waveguides while propagating the polymer waveguides.

13. The monomeric formulation of claim 12, wherein the first molecule is between 3% and 97% by weight of the monomeric formulation.

14. The monomeric formulation of claim 12, wherein the first molecule comprises at least one C═C double bond or C≡C triple bond located at a terminal position of the first molecule.

15. The monomeric formulation of claim 12, wherein the first molecule comprises one or more vinyl groups.

16. The monomeric formulation of claim 12, wherein the first molecule is selected from the group consisting of pentaerythritol tetraacrylate; 2,4,6-triallyloxy-1,3,5-triazine; triallyl-1,3,5-triazine-2,4,6-trione; and combinations thereof.

17. The monomeric formulation of claim 12, wherein the second molecule is between 3% and 97% by weight of the monomeric formulation.

18. The monomeric formulation of claim 12, wherein the second molecule comprises an alkyl group or an ester group.

19. The monomeric formulation of claim 12, wherein the photoinitiator is more than 0% and less than 10% of total weight of the monomeric formulation.

20. The monomeric formulation of claim 12, wherein the photoinitiator generates free radicals under a light exposure by one of intramolecular bond cleavage or intermolecular hydrogen abstraction.

21. The monomeric formulation of claim 20, wherein the light exposure is produced from a light having a wavelength between 200 nm and 500 nm.

22. The monomeric formulation of claim 12, wherein the photoinitiator is selected from the group consisting of 2,2-dimethoxy-2-phenylacetophenone; 2-hydroxy-2-methylpropiophenone; camphorquinone; benzophenone; benzoyl peroxide; and combinations thereof.

23. A system for forming at least one self-propagating polymer waveguide by photopolymerization, the system comprising:
   a collimated light source for producing a light beam;
   a reservoir having a monomeric formulation adapted to polymerize under a light exposure generated by the light beam; and
   a patterning apparatus configured to guide a portion of the light beam into the monomeric formulation to form at least one polymer waveguide through a portion of a volume of the monomeric formulation,
   wherein the monomeric formulation comprises:
      a first molecule comprising at least one C=C double bond or C≡C triple bond;
      a second molecule comprising two or more —SH groups;
      a photoinitiator selected from the group consisting of 2,2-dimethoxy-2-phenylacetophenone; 2-hydroxy-2-methylpropiophenone; camphorquinone; benzophenone; and benzoyl peroxide; and
      a free radical inhibitor comprising a compound selected from the group consisting of methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations thereof, the free radical inhibitor being present at a positive amount between 0-3% by weight of the monomeric formulation, and the free radical inhibitor being present in an amount sufficient to reduce polymerization of the monomeric formulation outside the waveguides while propagating the polymer waveguides.

24. A method for forming at least one polymer waveguide, the method comprising:
   forming a volume of a monomeric formulation comprising a first molecule comprising at least one C=C double bond or C≡C triple bond; a second molecule comprising two or more —SH groups; a photoinitiator; and a free radical inhibitor comprising a compound selected from the group consisting of methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations thereof, the free radical inhibitor being present at a positive amount between 0-3% by weight of the monomeric formulation, and the free radical inhibitor being present in an amount sufficient to reduce polymerization of the monomeric formulation outside the waveguides while propagating the polymer waveguides;
   securing a mask having at least one aperture between a collimated light source and the volume of the monomeric formulation; and
   directing a collimated light beam from the collimated light source to the mask for a period of exposure time so that a portion of the collimated beam passes through the mask and is guided by the at least one aperture into the volume of the monomeric formulation to form at least one waveguide through a portion of the volume of the monomeric formulation.

* * * * *